United States Patent [19]

Alonas et al.

[11] Patent Number: 4,458,408

[45] Date of Patent: Jul. 10, 1984

[54] METHOD FOR MAKING A LIGHT-ACTIVATED LINE-OPERABLE ZERO-CROSSING SWITCH

[75] Inventors: Paul G. Alonas, Mesa; David M. Gilbert, Scottsdale; Vernon P. O'Neil, II, Tempe, all of Ariz.

[73] Assignee: Motorola, Inc., Schaumburg, Ill.

[21] Appl. No.: 484,080

[22] Filed: Apr. 11, 1983

Related U.S. Application Data

[60] Division of Ser. No. 288,861, Jul. 31, 1981, Pat. No. 4,396,932, which is a continuation of Ser. No. 916,319, Jun. 16, 1978, abandoned.

[51] Int. Cl.³ .......................................... H01L 29/747
[52] U.S. Cl. ................................... 29/576 C; 357/35; 357/39; 357/23; 357/30; 357/47; 29/572
[58] Field of Search ............... 307/252 A, 252 B, 311, 307/304; 357/35, 38, 36, 39, 23, 30, 43; 29/576 C, 572

[56] References Cited

U.S. PATENT DOCUMENTS

| | | | |
|---|---|---|---|
| 3,427,512 | 2/1969 | Mapother | 357/38 |
| 3,432,731 | 3/1969 | Whittier | 357/38 |
| 3,812,405 | 5/1974 | Clark | 357/38 |
| 3,831,187 | 8/1974 | Neilson | 357/38 |
| 4,015,143 | 3/1977 | Tokunaga et al. | 307/252 J |
| 4,084,110 | 4/1978 | Okuhara et al. | 307/252 G |
| 4,100,565 | 7/1978 | Khajezadeh et al. | 357/51 |
| 4,224,634 | 9/1980 | Svedberg | 357/39 |
| 4,396,932 | 8/1983 | Alonas et al. | 357/39 |

Primary Examiner—T. Tung
Assistant Examiner—Nathan Thane
Attorney, Agent, or Firm—Robert M. Handy

[57] ABSTRACT

A monolithic light-activated line-operable zero-crossing switch and method of making the same. The device comprises anti-parallel thyristors, each of whose gates is shunted by a field effect transistor. Each device may also be shunted by a resistor to reduce the overall sensitivity. The method of making the device contemplates surrounding the field effect transistor gate electrode and an internal shunt electrode by the primary metallization which forms the contact to the two main terminals of the device.

5 Claims, 5 Drawing Figures

METHOD FOR MAKING A LIGHT-ACTIVATED LINE-OPERABLE ZERO-CROSSING SWITCH

This is a division of application Ser. No. 288,861, filed on July 31, 1981, now U.S. Pat. No. 4,396,932, which is a continuation of application Ser. No. 916,319, filed June 16, 1978, now abandoned.

SUMMARY OF THE INVENTION

BACKGROUND OF THE INVENTION

The present invention generally relates to switching circuits and more especially to a thyristor of planar construction which is optically triggerable only at the zero-crossing point. The preferred embodiment comprises a monolithic triac which is capable of blocking operation up to and exceeding 120 volt AC rms line voltages.

DESCRIPTION OF PRIOR ART

Thyristors are conventional solid state devices which have a large blocking voltage capability which is a function of the mode of construction and which in their on condition switch to a voltage of about 1 volt. Switching into the on condition can be achieved by exceeding the breakover voltage of the device in its blocking state or by application of a small signal to the gate of the thyristor. It is also well known to trigger or fire the thyristor by the application of a photo-signal to the device in order to achieve the triggering function. Triacs are thyristors connected in inverse parallel and it is also well known to trigger such devices by either a single gate terminal or by the application of light.

One form of a monolithic integrated planar thyristor is shown in U.S. Pat. No. 3,427,512 which is hereby incorporated by reference. This patent describes the bilateral triac which is triggerable in the breakover mode by virtue of shunting the high-voltage blocking junctions with zener diodes of known breakdown capability. Also described in this patent is the shunting of the gate structures of each of the thyristors in order to reduce the sensitivity of the device to ensure that it fires or switches only in the breakover mode. Even without the shunt zener diodes, the structures described in this patent are inherently incapable of blocking the high peak voltages which would be encountered in a line-operated application. While gate means could be added to the devices described in the referenced patent in order to fire the thyristor at a voltage lower than the breakover voltage, known gate means do not allow the firing to take place only at or near the point where zero voltage is applied across the main terminals of the device. Whether such a triac is used by itself or in conjunction with other thyristors, firing at high values of main terminal voltages is generally undesirable because of the generation of noise and the possibility of premature device failure because of high localized current density. In addition, a gate means integral with the device often provides insufficient isolation from the line voltage.

There are many references showing schemes for achieving zero point switching utilizing thyristors. Some of these are shown in U.S. Pat. Nos. 3,335,291; 3,648,075; 3,649,849; 3,860,837 and 3,805,147. These references all show multi-component systems which would be very difficult to integrate. It is possible that the desired component isolation could be achieved by exotic techniques such as dielectric isolation of the component from the thyristor but such techniques have not proven economical for mass application.

The problem of insufficient isolation has a known solution in the use of light to trigger the thyristor. This is discussed in a great many references. While the use of optical triggering solves the isolation problem, it is most useful in conjunction with the zero-crossing scheme for the reasons mentioned above. This application discloses a process for monolithically integrating inverse parallel thyristors together with devices to inhibit their firing other than at low voltages. These objectives are achieved simultaneously with voltage capability at least as high as required for line voltage application.

It has been found that when a thyristor is comprised of a vertical transistor in conjunction with a lateral transistor, that firing can be inhibited by means of a monolithic MOS field effect transistor connected from the gate to the cathode of the device. When a triac is formed by fabricating two such devices on a semiconductor monolith, the desired triggering function is achieved. By maintaining certain geometrical relationships between the thyristor and field effect devices, a high voltage composite device may be formed. Various details of the invention will become clear from the following description and drawings of the invention and the novel elements will be particularly identified in connection with the appended claims.

DETAILED DESCRIPTION OF THE PREFERRED EMBODIMENT(S)

Figure 1:
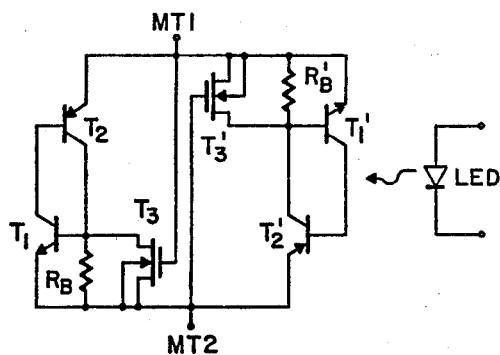
FIG. 1 is a circuit diagram of the basic switch.

FIG. 1 is an equivalent schematic representation of the optically activated zero crossing switching device. Transistor $T_1$ together with $T_2$ and transistor $T_1'$, together with $T_2'$ respectively form two thyristors in the so-called back-to back or inverse parallel configuration. Resistors $R_B$ and $R_B'$ shunt transistors $T_1$ and $T_1'$ respectively in order to reduce the sensitivity of each of the thyristors and preclude triggering by unwanted signals. Transistors $T_3$ and $T_3'$ also shunt transistors $T_1$ and $T_1'$, respectively; these field-effect effect transistors $T_3$ and $T_3'$ are preferably enhancement type field effect transistors which do not conduct when the voltage across main terminals MT1 and MT2 is zero, but which go into conduction when the voltage between MT1 and MT2 is above the threshold voltage of the field effect transistor $T_3$ and $T_3'$. A significant salutory effect of the employment of MOS field effect transistors in this circuit is the fact that their gate terminals draw minute amounts of current so that very little current passes between MT1 and MT2 when the switching device is in the OFF state. The LED shown in FIG. 1 is conventional and serves as the source for photons which couple with the bipolar transistors and causes the thyristors to be switched ON. The LED may be placed in the same encapsulation as the switching device by known techniques.

Where the bilateral trigger of FIG. 1 is not required to carry a substantial current, transistors $T_2$ and $T_2'$ are most conveniently implemented as lateral transistors. If these lateral transistors have a substantial reverse blocking voltage capability for both their emitter-base and collector-base junctions, the blocking function of the switch of FIG. 1 is not lost if the collectors of $T_1$ and $T_1'$ are directly interconnected. Since the collectors of $T_1$ and $T_1'$ are connected directly to the base of $T_2$ and $T_2'$ respectively, the entire trigger may be formed in a monolith of one conductivity type semiconductor material which serves as the base of both lateral transistor and as the collector of both vertical transistors. The MOS field effect transistors $T_3$ and $T_3'$ have the same channel conductivity type as do the bases of transistors $T_2$ and $T_2'$. Thus the MOS transistors $T_3$ and $T_3'$ may be implemented by forming opposite conductivity type regions in the common substrate as long as the blocking capability of these regions is also sufficiently high for the desired application. Clearly, the gate breakdown capability of the MOS transistors must also be at least equal to the expected peak-to-peak voltages or about 200 volts in the case of a device intended for line operation.

Figure 2:
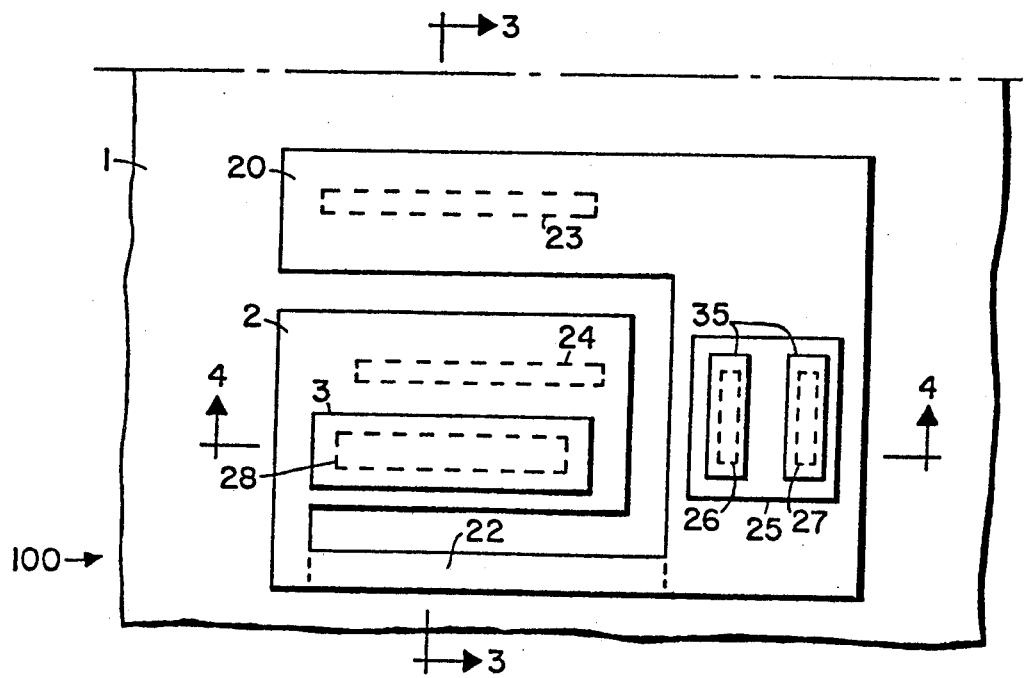
FIG. 2 is a top-view of one of the thyristors of the bilateral device showing the details of the various regions of different conductivity type in the semiconductor monolith.
Figure 3:
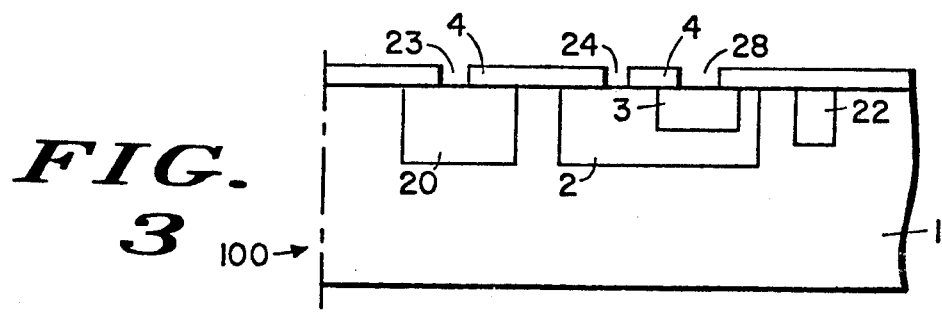
FIGS. 3 and 4 are cross sections of FIG. 2 showing further details of the construction of the single thyristor.
Figure 4:
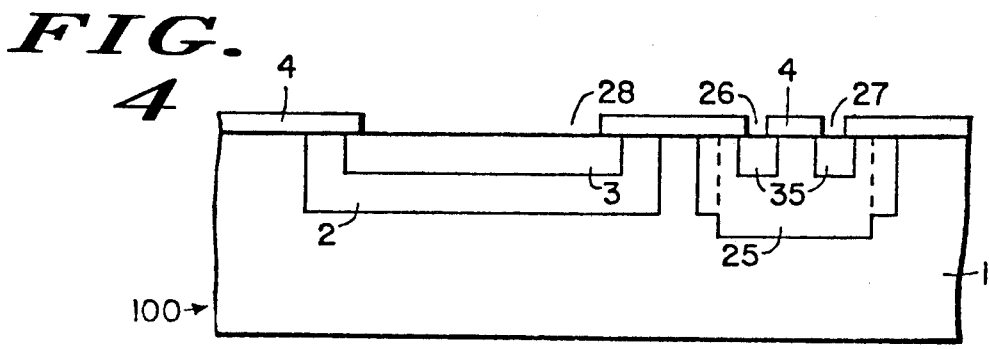

FIG. 2 is a top view of one-half of the integrated device showing especially the various semiconductor regions needed to implement the circuit if FIG. 1 in monolithic form. The completed device is preferably symmetrical about the center line shown at the top of the Figure. FIGS. 3 and 4 are cross-sections of FIG. 2 which more particularly point out features of the various regions of the device. For the sake of definiteness, specific conductivity types will be ascribed to each of the regions in these Figures. However, it will be appreciated that all the conductivity types may be reversed and the same function is achieved. Region 1 of substrate 100 is preferably of N conductivity type with a resistivity in the range of 1 to 100 ohm-centimeters in order to achieve the desired blocking voltage. Region 2 is formed by conventional techniques to provide a base region in a portion of the substrate 1 and region 3 is also formed by conventional techniques to provide an N-type emitter region in a portion of region 2. The NPN vertical transistor thus formed implements the bipolar transistor shown schematically as $T_1$ in FIG. 1. P-type region 20 is preferably formed simultaneously with region 2 and serves as the emitter of bipolar lateral transistor $T_2'$. P-type region 2 also serves as the collector for lateral transistor $T_2$. P-type region 22 which connects P-type regions 2 and 20 implements the resistor $R_B$ which connects the base of transistor $T_1$ to the emitter of transistor $T_2'$. $R_B$ is in the range 50K to 300K ohms. The emitter of $T_2'$ is also common with the P-type region 25 which serves as the channel region of N-channel MOS transistor $T_3$. P-type region 25 is typically of higher resistivity than regions 2 or 20 in order to provide a suitable threshold voltage for the N-channel MOS transistor so that firing of the $T_1$-$T_2$ combination is inhibited. Dual N-type regions 35 serve as source and drain of this MOS transistor; these regions are preferably formed simultaneously with emitter region 3. Insulating layer 4, which is typically an oxide, serves as the gate insulator of the MOS field effect transistor as well as providing insulation for the device interconnection metal which is more fully described in conjunction with FIG. 5. To achieve high voltage capability, the insulator 4 is somewhat thicker than the conventional 1000 Angstrom value for MOS transistors in the region between source and drain 35. The insulator may be even thicker over the other regions of the device. As may be seen from FIGS. 3 and 4, the dashed regions internal to regions 2, 3, 20 and 35 in FIG. 1 are apertures in the insulator to permit connection to the individual semiconducting regions.

Figure 5:
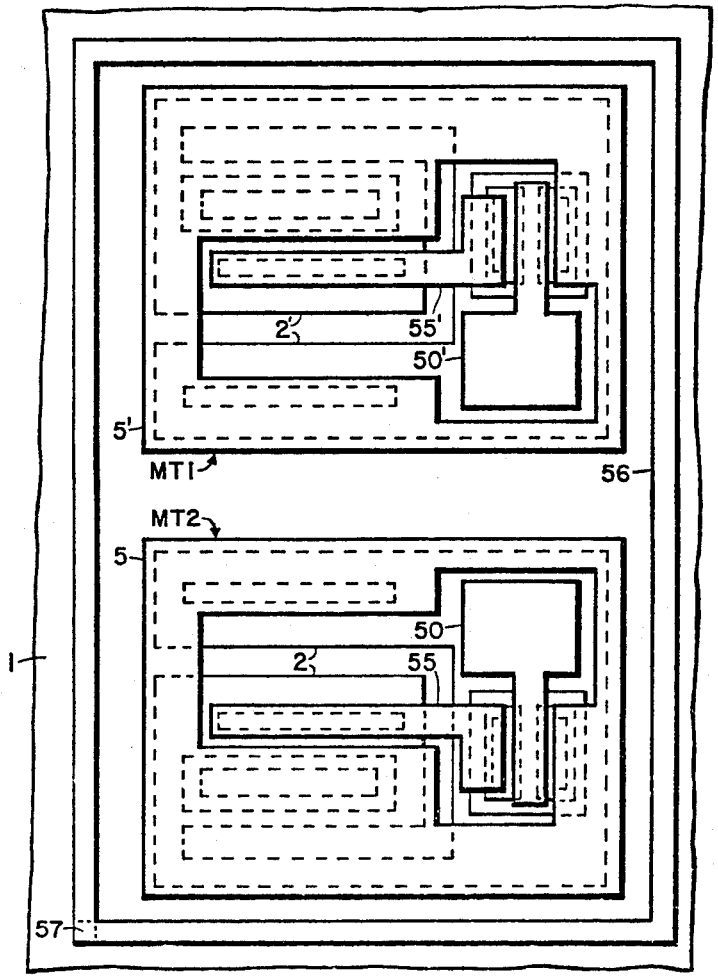
FIG. 5 is a top view of the completed device, showing both of the thyristors and their attendant metallization pattern.

FIG. 5 is a top view of the completed device showing both halves of the device with the interconnecting metallization in place. The interconnecting metal also has expanded regions allowing for external connection to the monolithic element. That is, regions 50 allow connection to the gates of the field effect transistors, which gates are the protuberances on the areas 50. The metallized regions 5 completely surround gates 50 and overlay the perimeter of the major P-regions of the device. Thus, the high voltage blocking junction is almost completely overlaid by a conductor which serves to distribute the field and thus enhance the blocking voltage of the device. External main terminal connections are effected by attaching conductors to both of the regions 5; these external conductors also connect to gate connection regions 50 so that they are electrically common with the peripheral substrate metallization 56–57 or the appropriate (opposite) main terminal metallization. It will be seen that the emitter regions of the lateral PNP transistors are separated from their collector regions by the other emitter region of the lateral PNP transistor. By forming the emitter regions of the PNP transistors in this configuration, it is possible to overlay all the P-regions which are at approximately the same operating potential by the same region of device metallization. Alternatively, emitter regions 20 could lie outside the base regions 2. Main terminal metallization 5 also connects to the source of the field effect transistor, and metallization 55 connects the drain of the field-effect transistor to base of the vertical NPN transistor.

It is apparent from FIG. 5 that not all of the blocking junctions formed by regions 2 and 20 together with opposite-conductivity type region 1 are overlaid by the device metallization. Specifically there are regions between metal 5 and 55 which are not overlaid. However, because the blocking junctions in these regions face each other with a relatively small separation, depletion from both sides and the fact that the metallizations 5 and 55 are always at approximately the same potential (tending to equalize the surface potential of the insulator 4) preclude premature breakdown of the junctions in these regions.

It is also apparent that a unilateral device can be implemented by forming two regions of second conductivity type in a first conductivity type substrate, forming a vertical bipolar transistor and an MOS transistor in one of the two regions, and connecting the gate of the MOS transistor to the substrate. Such a configuration may impair the blocking voltage with respect to the more elaborate embodiments described in the foregoing specification wherein the gate of the MOS transistor is connected to a region of second conductivity type, but has the advantage of a simpler process. The function of the shunting resistors $R_B$ may be merged with the MOS transistor by forming the transistor of the depletion type, where some source-drain current can flow for zero gate voltage.

What is claimed is:

1. In a method for forming a monolithic light-operated thyristor trigger switch composed of vertical transistors and lateral transistors, each having an emitter, base, and collector region, the improvement comprising:

disposing the emitter region of a first of the lateral transistors so as to lie between the emitter and collector regions of a second of the lateral transistors; and disposing the emitter region of a second of the lateral transistors so as to lie between the emitter and collector regions of the first of the lateral transistors.

2. The method of claim 1 further comprising locating the emitter regions of the first and second lateral transistors in a substantially parallel separated relationship.

3. The method of claim 2 further comprising forming the collector regions of the vertical transistors and base regions of the lateral transistors from a common semiconductor region.

4. The method of claim 3 further comprising providing at least one field effect transistor having current carrying terminals connected to the base region of at least one vertical transistor and the emitter region of the same vertical transistor, and having a gate region coupled to the collector of the same vertical transistor.

5. The method of claim 4 further comprising grouping together the emitter region of the first lateral transistor and the collector region of the second lateral transistor in a substantially adjacent but spaced apart relationship to form a first emitter-collector pair, and the emitter region of the second lateral transistor and the collector regions of the first lateral transistor in a substantially adjacent but spaced apart relationship to form a second emitter-collector pair, further grouping the pairs in a substantially parallel adjacent spaced apart relationship, and substantially covering a periphery of each pair by a separate metallic electric field distributing conductor to enhance the blocking voltage of each pair.

* * * * *